US010699950B2

(12) United States Patent
Clevenger et al.

(10) Patent No.: US 10,699,950 B2
(45) Date of Patent: Jun. 30, 2020

(54) METHOD OF OPTIMIZING WIRE RC FOR DEVICE PERFORMANCE AND RELIABILITY

(71) Applicant: ELPIS TECHNOLOGIES INC., Ottawa (CA)

(72) Inventors: Lawrence A. Clevenger, LaGrangeville, NY (US); Baozhen Li, South Burlington, VT (US); Kirk D. Peterson, Jericho, VT (US); John E. Sheets, II, Zumbrota, MN (US); Terry A. Spooner, Clifton Park, NY (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 23 days.

(21) Appl. No.: 15/889,248

(22) Filed: Feb. 6, 2018

(65) Prior Publication Data

US 2018/0158731 A1    Jun. 7, 2018

Related U.S. Application Data

(62) Division of application No. 14/872,302, filed on Oct. 1, 2015, now Pat. No. 9,997,408.

(51) Int. Cl.
| | |
|---|---|
| *H01L 21/00* | (2006.01) |
| *H01L 21/768* | (2006.01) |
| *H01L 21/66* | (2006.01) |
| *G06F 30/36* | (2020.01) |
| *G06F 30/367* | (2020.01) |
| *G06F 30/392* | (2020.01) |
| *G06F 30/398* | (2020.01) |

(52) U.S. Cl.
CPC ........ *H01L 21/76892* (2013.01); *G06F 30/36* (2020.01); *G06F 30/367* (2020.01); *G06F 30/392* (2020.01); *G06F 30/398* (2020.01); *H01L 22/20* (2013.01)

(58) Field of Classification Search
CPC .............. H01L 21/76892; H01L 22/20; G06F 17/5036; G06F 17/5063; G06F 17/5072; G06F 17/5081
USPC ........................................... 702/187; 438/13
See application file for complete search history.

(56) References Cited

U.S. PATENT DOCUMENTS

| | | | |
|---|---|---|---|
| 6,124,197 | A | 9/2000 | Fulford |
| 6,615,400 | B1 | 9/2003 | Lukanc |
| 7,627,836 | B2 | 12/2009 | Culp et al. |

(Continued)

OTHER PUBLICATIONS

U.S. Appl. No. 14/872,302, Restriction Requirement dated Dec. 14, 2016, pp. 1-5.

(Continued)

*Primary Examiner* — Brook Kebede
(74) *Attorney, Agent, or Firm* — Borden Ladner Gervais LLP; Shin Hung

(57) ABSTRACT

A method of tailoring BEOL RC parametrics to improve chip performance. According to the method, an integrated circuit design on an integrated circuit chip is analyzed. The analysis comprises calculating Vmax for vias and metal lines in the integrated circuit design over a range of sizes for the vias and the metal lines. Predicted use voltage for applications on the integrated circuit chip is determined. The size or the location of at least one of the vias and the metal lines is tailored based on performance parameters of the integrated circuit chip.

20 Claims, 6 Drawing Sheets

(56) References Cited

U.S. PATENT DOCUMENTS

| | | | |
|---|---|---|---|
| 7,721,239 B2 | 5/2010 | Kato et al. | |
| 8,309,458 B2 | 11/2012 | Lee | |
| 8,468,482 B1 | 6/2013 | Pack et al. | |
| 8,572,537 B2 | 10/2013 | Su et al. | |
| 8,912,530 B2 | 12/2014 | Yang et al. | |
| 8,959,471 B2 | 2/2015 | Qian | |
| 2010/0122231 A1* | 5/2010 | Agarwal | G03F 1/36 716/53 |
| 2014/0195995 A1* | 7/2014 | Bickford | G06F 17/5009 716/113 |

OTHER PUBLICATIONS

U.S. Appl. No. 14/872,302, Office Action Communication dated Apr. 21, 2017, pp. 1-14.

U.S. Appl. No. 14/872,302, Office Action Communication dated Nov. 1, 2017, pp. 1-7.

U.S. Appl. No. 14/872,302, Notice of Allowance dated Jan. 18, 2018, pp. 1-8.

* cited by examiner

METHOD OF OPTIMIZING WIRE RC FOR DEVICE PERFORMANCE AND RELIABILITY

CROSS-REFERENCE TO RELATED APPLICATIONS

The present application claims the benefit under 35 U.S.C. § 120 as a division of U.S. patent application Ser. No. 14/872,302 filed on Oct. 1, 2015, the entire teachings of which are incorporated herein by reference.

BACKGROUND

The present disclosure relates to integrated circuit design and more particularly to wiring layout in order to maximize device performance and reliability.

Electronic devices, particularly integrated circuits, comprise a large number of components fabricated by layering several different materials onto a silicon wafer. In order for the components to function as an electronic device, they are selectively, electrically connected to one another. Metal lines are utilized to electrically connect components. The metal lines provide electrical connection within a layer, while vias connect different metallization and via layers. It is important that a good connection between the via and metal line exists in order to ensure that the proper amount of current is carried with minimal resistance between the connected components.

Unfortunately, a mechanism that causes reliability problems seen in integrated circuits results from time-dependent gate dielectric breakdown (or time dependent dielectric breakdown—TDDB). Time dependent dielectric breakdown is a failure mechanism that occurs when the dielectric breaks down as a result of long-time application of relatively low electric field (as opposed to immediate breakdown, which is caused by strong electric field). The breakdown is caused by formation of a conducting path through the dielectric to an interconnect on a different voltage net due to electron tunneling current. This typically occurs when interconnects are operated close to or beyond their specified operating voltages.

In addition, the maximum voltage (Vmax) of the technology defines the space between features on the chip, such as between a contact via and a polysilicon line layer (CA/PC), between metallization lines (M1/M1), etc., due to TDDB. This limits how conductive the contact via, metallization line, etc. can be. Accordingly, the Vmax limits how high in performance the chip can reach.

SUMMARY

The present disclosure provides a method to feedforward device parameters that predict the end application voltage and adjust the feature sizes larger (smaller space between features) when the device is fast, and the voltage will be lower. This can lead to better chip performance and better yield for the chips.

According to a method, an integrated circuit design on an integrated circuit chip is analyzed. The analysis comprises calculating Vmax for vias and metal lines in the integrated circuit design over a range of sizes for the vias and the metal lines. Predicted use voltage for applications on the integrated circuit chip is determined. One of the size and the location of at least one of the vias and the metal lines is tailored based on performance parameters of the integrated circuit chip.

According to a method of tailoring BEOL RC parametrics to improve chip performance using a data processing system, a circuit design on a chip is analyzed by the data processing system. The analysis comprises calculating Vmax for vias and metal lines in the circuit design over a range of sizes for the vias and metal lines. Predicted use voltage for applications on the chip is determined by the data processing system. The predicted use voltage is compared to Vmax calculated for the vias and metal lines, by the data processing system. The circuit design is modified based on performance parameters of the chip.

According to a computer program product for tailoring BEOL RC parametrics to improve chip performance in an integrated circuit design, the computer program product comprises a computer readable storage medium having program instructions embodied therewith. The program instructions are readable/executable by a processor to cause the processor to perform a method. According to the method, a circuit design on a chip is analyzed. The analysis comprises calculating Vmax for vias and metal lines in the circuit design over a range of sizes for the vias and metal lines. Predicted use voltage is determined for applications on the chip. The predicted use voltage is compared to Vmax calculated for the vias and metal lines. The circuit design is modified based on performance parameters of the chip.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
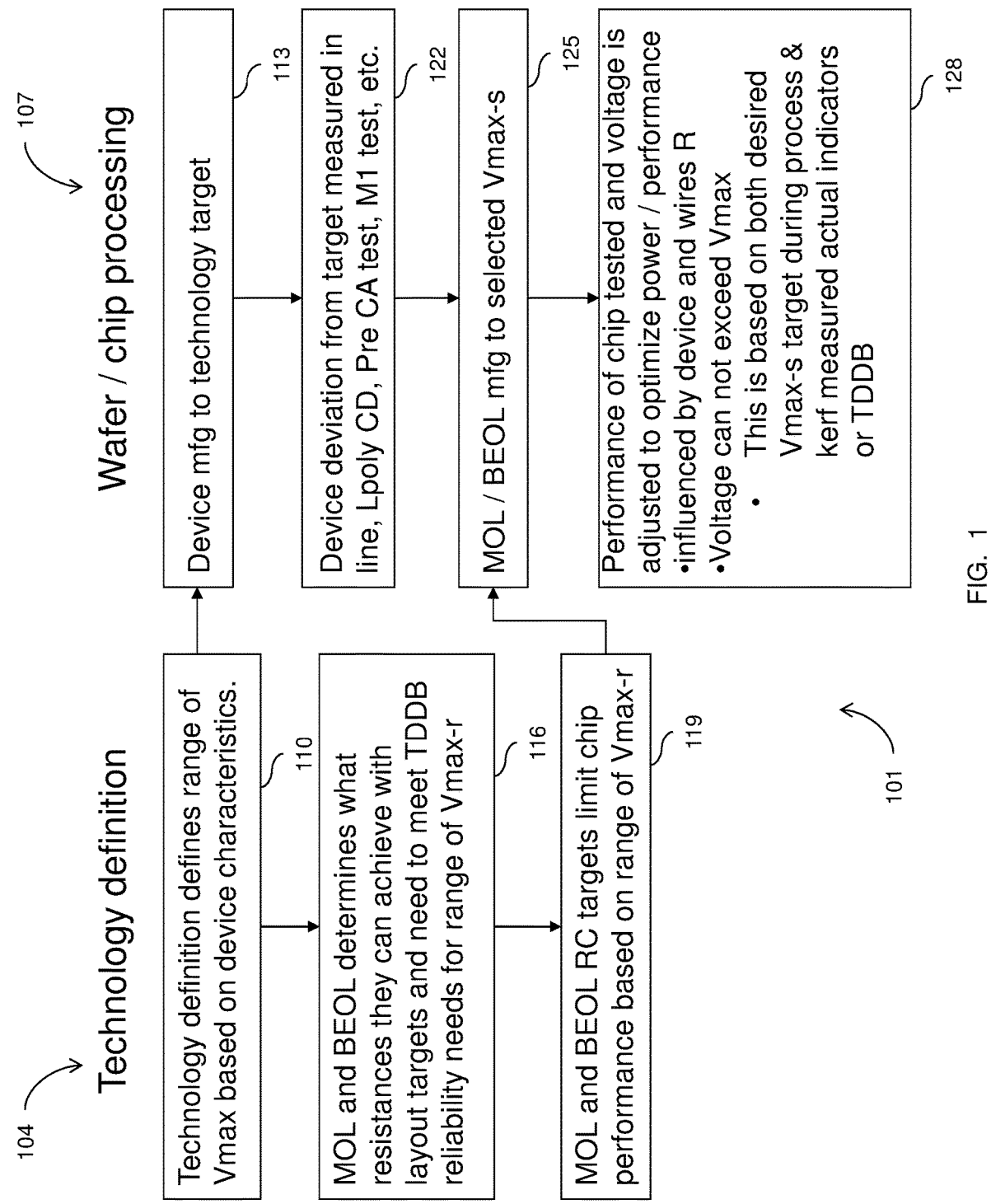
FIG. 1 is an illustration of a high-level processing flow according to devices and methods herein.

The disclosure will now be described with reference to integrated circuit manufacturing in which device centering information is feedforwarded in order to tailor back-end-of-line (BEOL) parametrics to improve chip performance, particularly with regard to Resistor-Capacitor (RC) timing. While the disclosure will be described hereinafter in connection with specific devices and methods thereof, it will be understood that limiting the disclosure to such specific systems and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. In the drawings, like reference numerals have been used throughout to identify identical elements.

Typically, the technology definition for components on an integrated circuit chip defines the maximum voltage (Vmax) based on device characteristics. Middle-of-line (MOL) and back-end-of-line (BEOL) processing determines what resistances (R) can be achieved with layout targets and the requirement to meet TDDB reliability standards for Vmax. The device may then be manufactured to the technology target. MOL/BEOL manufacturing is performed to the technology target. Note that the MOL and BEOL targets associated with RC targets can limit the chip performance. Overall, the chip performance is influenced by the installed device and resistance of the wire. Once the chip has been manufactured, performance of the chip may be tested and the applied voltage may be adjusted to optimize power/performance. In any event, the use voltage cannot exceed Vmax.

FIG. 1 shows a high-level processing flow, indicated generally as 101, according to devices and methods herein. As shown in FIG. 1, the processing flow is divided into two general portions, the definition of the technology for the device, indicated as 104, and processing of the wafer or chip, indicated as 107. The technology definition for components on an integrated circuit chip defines a range of maximum voltages (Vmax-r) based on device characteristics (110). The device may be manufactured to the technology target (113). Middle-of-line (MOL) and back-end-of-line (BEOL) processing determines what resistances (R) can be achieved with the layout targets and the requirement to meet TDDB reliability standards for the range of Vmax-r (116). Note that BEOL processing may suffer from RC delay due to long metallization line lengths and next-neighbors. The resistance (R) may be improved by making the metallization line wider; however, this creates capacitive (C) issues. That is, the MOL and BEOL targets associated with RC timing delay can limit the chip performance based on the range of Vmax-r (119). The selection of certain performance limiting features that may affect overall chip performance can be done by addressing the performance shortcomings of those selected features through L-poly reduction, RC optimization, metallization placement, etc. In other words, device deviation from the target is measured in line, Lpoly CD, Pre CA test, M1 test, etc. (122). MOL/BEOL manufacturing is performed based on adjustments associated with a selected Vmax-s (125). Overall, the chip performance is influenced by device and wire resistance. Once the chip has been manufactured, performance of chip may be tested, and the applied voltage may be adjusted to optimize power/performance (128). As mentioned above, the use voltage cannot exceed Vmax. Performance testing may be based on the desired Vmax target during processing and kerf measured actual indicators or TDDB.

For constant electric field scaling:

$$\frac{V_{max}}{S_{min}} = E_{max}$$

Depending on dielectric and integration schemes, $E_{max}$ is typically in the range of approximately 1-2.0 MV/cm.

This can be used, for example, in evaluating minimum spacing between a polysilicon line layer and a contact via (PC-CA). If Vmax=1 V and $E_{max}$=1 MV/cm, then the minimum PC-CA spacing ($S_{min}$) is 10 nm. For a faster chip, if the Vmax can be decreased from 1 V to 0.8 V, then the $S_{min}$ can be relaxed from 10 nm to 8 nm. For a CA size of 20 nm in diameter, this relaxation can result in 44% CA cross sectional area ($A_c$) increase ($(24/20)^2$=1.44). Considering the CA resistance:

$$R_c = \rho(h_c/A_c)$$

this 44% increase in cross sectional area ($A_c$) translates to approximately 30.5% CA reduction in resistance. Similarly, if $E_{max}$=1.18 MV/cm, a decrease of Vmax from 1 V to 0.8 V can result in 15% CA diameter increase and 24% CA reduction in resistance.

Such 5.3% reduction in delay at constant Vdd would allow a corresponding increase in frequency. However, when the path speeds that much around 5% more frequency, the power requirement grows linearly, as does power supply noise, local heating etc. Therefore, at constant power one would have to drop Vdd slightly to compensate for the frequency increase and of course that slightly lower Vdd would support a slightly lower frequency.

A method of IC disposition includes the steps of determining one or more disposition criteria based at least in part on statistical timing of a given IC design; and determining whether a given IC according to the given IC design satisfies the one or more disposition criteria based at least in part on one or more measurements of at least one test structure, including, for example, frequency measurements of at least one performance sensitive ring oscillator (PSRO).

Figure 2:
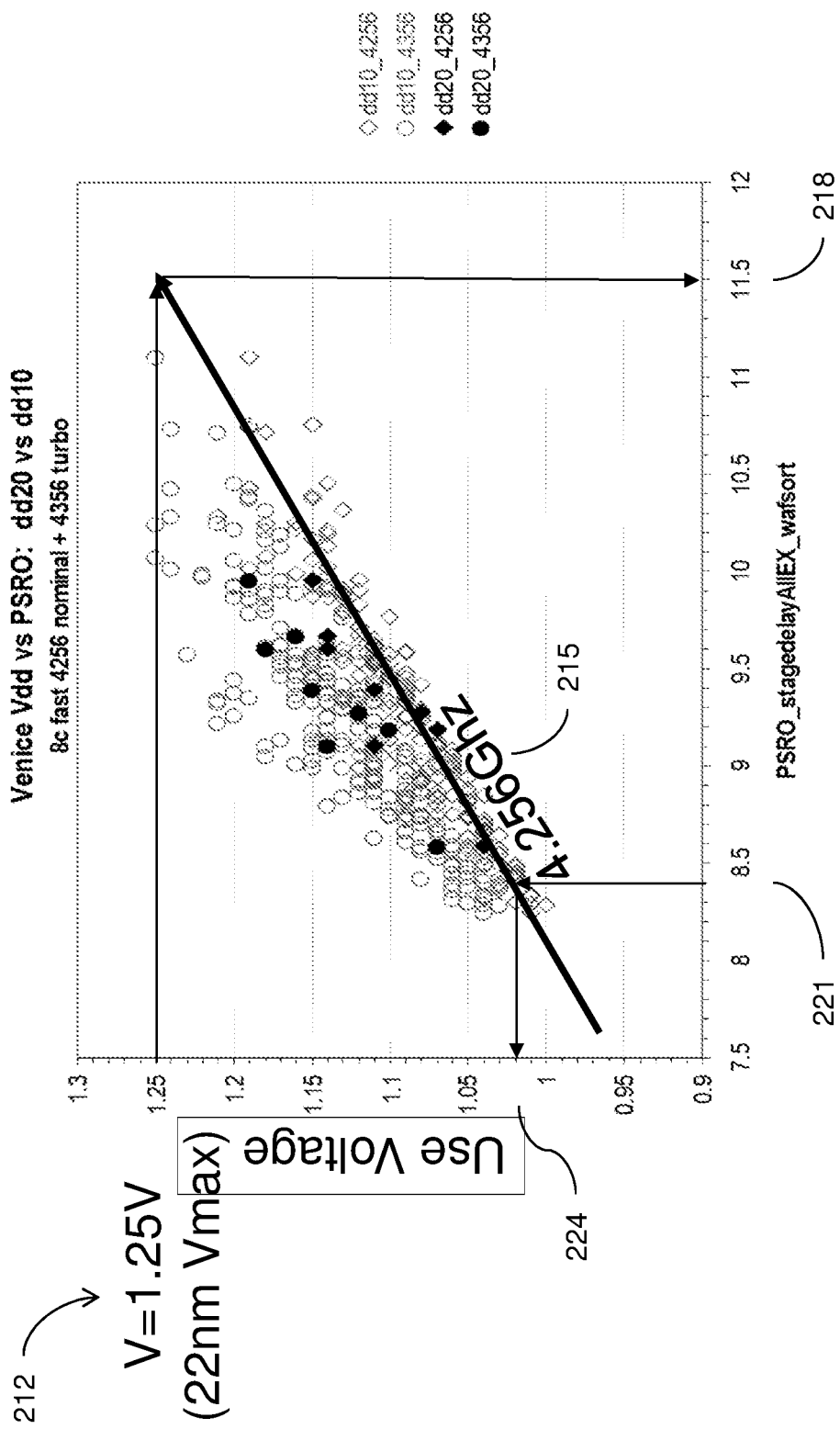
FIG. 2 is a graph of Use Voltage vs. Timing Delay according to devices and methods herein.

FIG. 2 illustrates an example of a timing change for 22 nm spacing. Vmax for the technology at 22 nm is 1.25 V, as shown at 212. In this example, the design frequency is 4.256 Ghz (215). At Vmax, the PSRO is approximately 11.5 psec, indicated at 218, which is considered very slow. However, at approximately 8.4 psec, indicated at 221, which is considered fast, the use voltage drops from 1.25 V (technology Vmax) to approximately 1.02 V, as shown at 224. This is a lowering of approximately 230 mV.

This means that a faster chip can have lower use voltage by approximately 200 mV. In other words, operation at 4.256 Ghz can be obtained at 1.02 V instead of Vmax for the technology at 1.25 V. Furthermore, by lowering the use voltage by approximately 200 mV lower than Vmax, the CA can be increased made approximately 44% larger in area, which provides approximately 30% reduction in resistance. That is, the electric field can stay the same as the PC-CA spacing decreases; accordingly, the CA can increase in size. With an approximately 30% reduction in resistance, the chip may now be able to go approximately 4% faster at a lower frequency. That is, the chip could perform at 4.426 Ghz using the lower 1.02 V.

Figure 3:
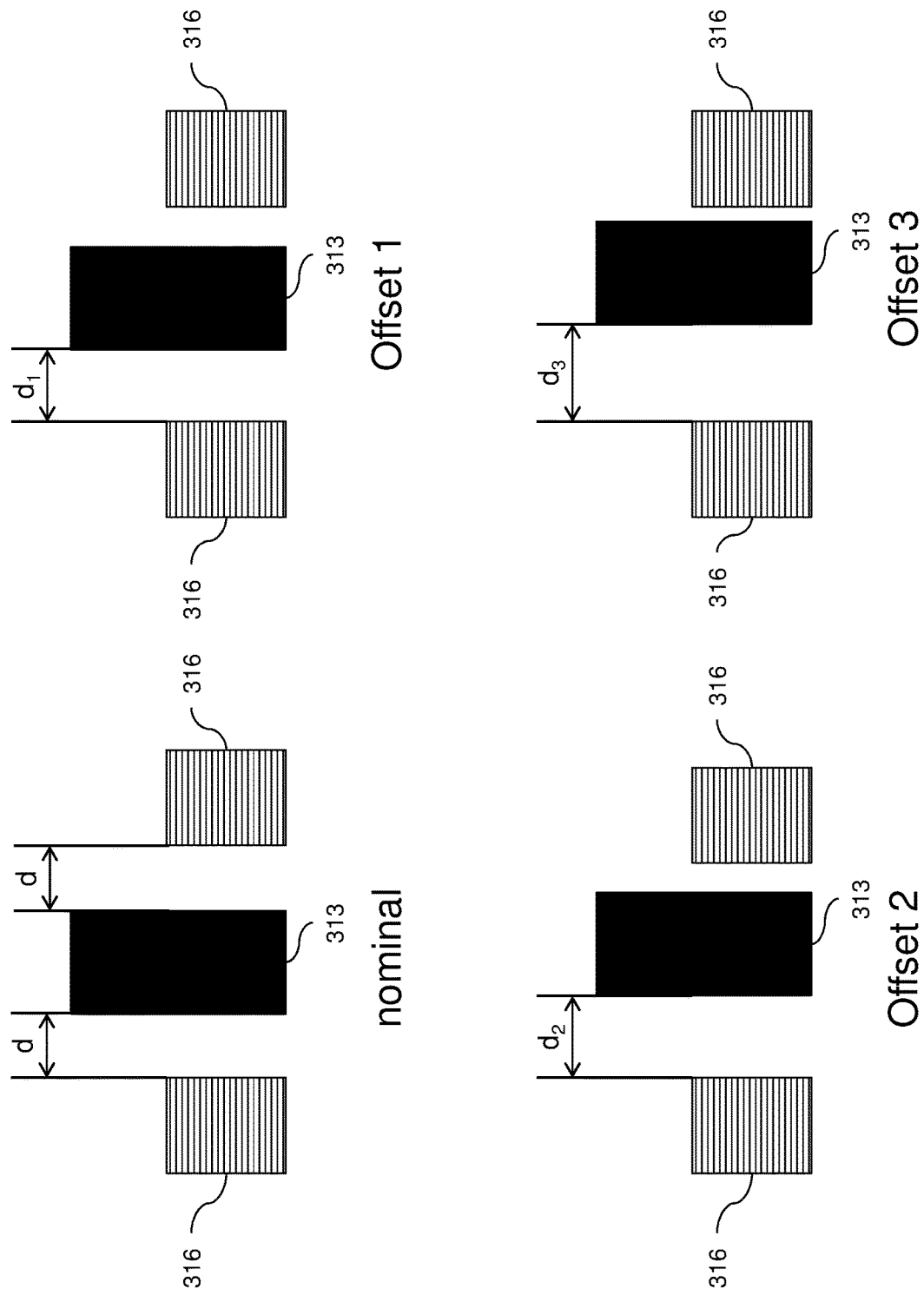
FIG. 3 is an illustration of exemplary offsets according to devices and methods herein.

Vmax can be established for an individual chip, an entire wafer of unsingulated chips, and/or a manufacturing lot. Verification testing can be performed at Wafer Final Test (WFT) using AC and DC testing performed on I/O circuits. Structures that look for PC/CA and M1 to CA shorts, as well as breakdown, may be created and put into the chip. Such structures may be used to detect both dimensional and overlay effects. Referring to FIG. 3, an exemplary structure of a contact via (CA) 313 is shown in relation to the line layer (PC) 316. In a nominal configuration, the contact via (CA) 313 is approximately centered in relation to the line layer (PC) 316, indicated by distance d. Testing can be performed for various offsets of the position of the contact via (CA) 313 in relation to the line layer (PC) 316. In the example of Offset 1, the contact via (CA) 313 is shifted closer to one edge of the line layer (PC) 316, such that $d_1$ is greater than d. Offset 2 and Offset 3 illustrate increasing offsets wherein $d_3 > d_2 > d_1 > d$. Either a test for shorts or a test for electrical breakdown can be used to determine PC to CA spacing. Then Vmax for the chip can be set based on the PC to CA spacing.

As described above, Vmax-r can be characterized for a range of sizes for the vias and metal lines to be tailored. Test and inline data can be used to predict the use voltage that the chips will actually experience in applications on a lot, wafer, or chip basis. Once the use voltage has been predicted, the predicted use voltage can be fed forward to the printing and etching instructions for MOL and/or BEOL processing of the via and line to be tailored. The size of the feature can be adjusted in MOL and/or BEOL processing, which also adjusts the resulting RC of the technology, in order to improve the chip performance. During testing, the operating voltage the chip will see (i.e., use voltage) can be verified to be consistent with the selected Vmax-s limitation. It is expected that MOL/BEOL response can be either continuous or bucketed, as necessary.

Verification can be done using a feedback loop at different levels of granularity (e.g., lot, wafer, or chip). Some of the variable inputs that can be used to predict device speed can include:

Inline physical measurements—such as Lpoly, fin height/thickness, etc.

Inline test measurements such as at pre-silicide test, M1 test, monitor wafers, etc. and can include such measurements as Vt, Ieff, etc.

While the above discussion is described in terms of positioning and sizing of vias and metallization layers as being most sensitive, other via/wire levels may also benefit. Additionally, what is most sensitive to changes in structure and geometry could change based on the technology and design. Furthermore, it is contemplated that tailoring of the dielectric constant for the wafer may be performed in a manner analogous to feature size tailoring described herein, which will impact RC while managing TDDB.

Figure 4:
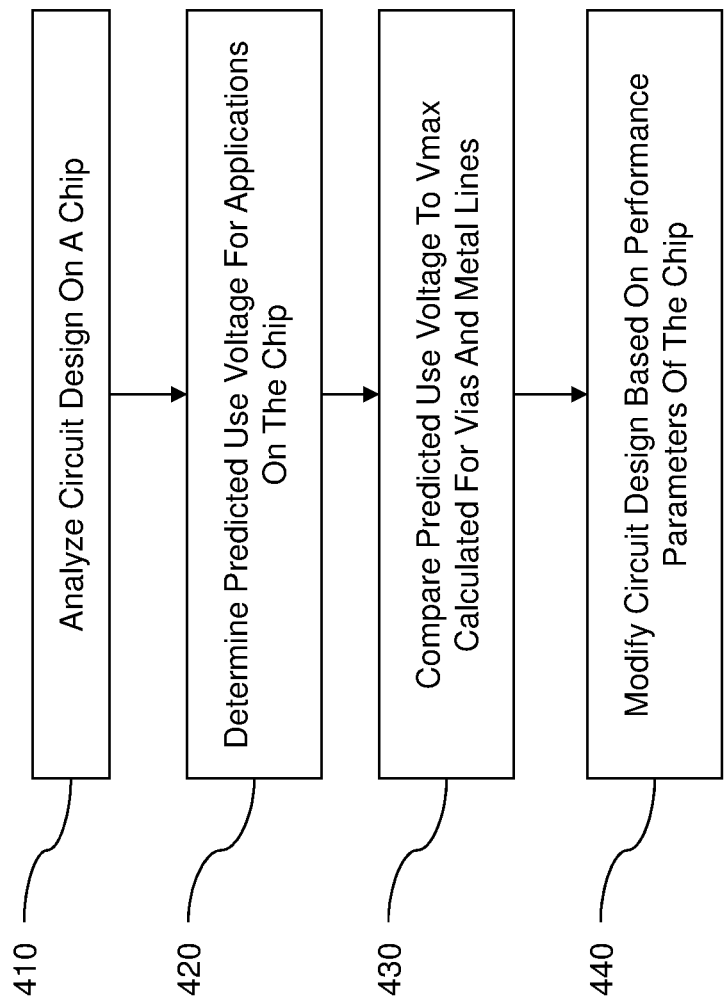
FIG. 4 is a flow diagram according to devices and methods herein.

FIG. 4 is a flow diagram illustrating the processing flow of an exemplary method of tailoring BEOL RC parametrics to improve chip performance according to devices and methods herein. In item 410, a circuit design on a chip is analyzed by a data processing system. The analysis comprises calculating Vmax for vias and metal lines in the circuit design over a range of sizes for the vias and metal lines. Predicted use voltage for applications on the chip is determined by the data processing system, at 420. The predicted use voltage is compared to Vmax calculated for the vias and metal lines, at 430. The circuit design is modified based on performance parameters of the chip, at 440, using the selected Vmax.

While only one or a limited number of transistors or devices are illustrated in the drawings, those ordinarily skilled in the art would understand that many different types of transistors or other technology could be simultaneously formed with the embodiment herein and the drawings are intended to show simultaneous formation of multiple different types of devices; however, the drawings have been simplified to only show a limited number of devices for clarity and to allow the reader to more easily recognize the different features illustrated. This is not intended to limit this disclosure because, as would be understood by those ordinarily skilled in the art, this disclosure is applicable to structures that include many of each type of transistor or technology shown in the drawings.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
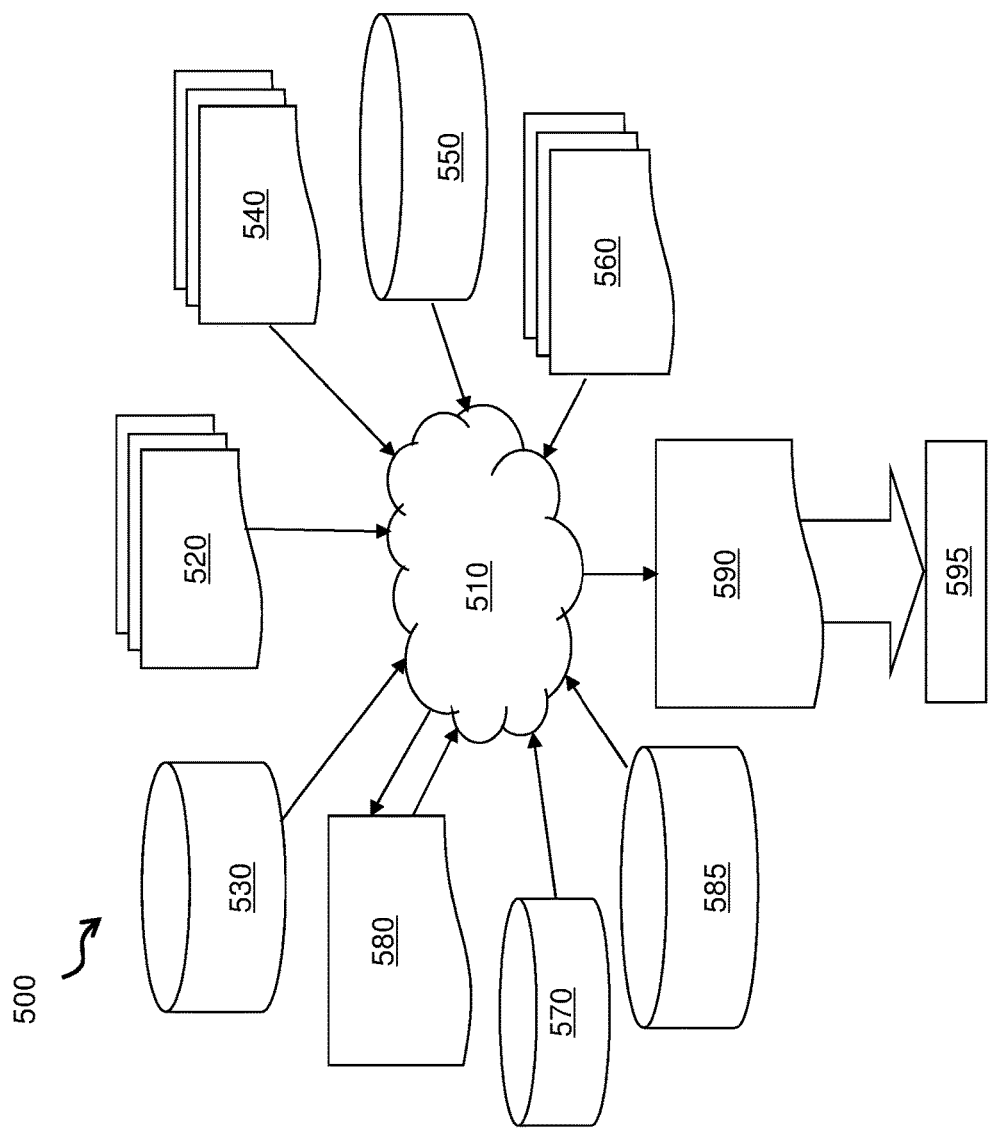
FIG. 5 is a block diagram illustrating an exemplary design flow used, for example, in the logic design, simulation, test, layout, and manufacture of the structures disclosed herein.

FIG. 5 shows a block diagram of an exemplary design flow 500 used for example, in semiconductor IC logic design, simulation, test, layout, and manufacture. Design flow 500 includes processes, machines, and/or mechanisms for processing design structures or devices to generate logically or otherwise functionally equivalent representations of the design structures and/or devices described above and shown in FIGS. 1-4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-4. As such, design structure 520 may comprise files or other data structures including human and/or machine-readable source code, compiled structures, and computer executable code structures that when processed by a design or simulation data processing system, functionally simulate, or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-4 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which Netlist 580 is resynthesized one or more times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 590 may comprise a compiled, executable HDL simulation model that functionally simulates the devices shown in FIGS. 1-4.

Design structure 590 may also employ a data format used for the exchange of layout data of integrated circuits and/or symbolic data format (e.g., information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 590 may then proceed to a stage 595 where, for example, design structure 590: proceeds to tape-out, is released to manufacturing, is released to a mask house, is sent to another design house, is sent back to the customer, etc.

Aspects of the present disclosure are described herein with reference to flowchart illustrations and/or block diagrams of methods, apparatus (systems), and computer program products according to devices and methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
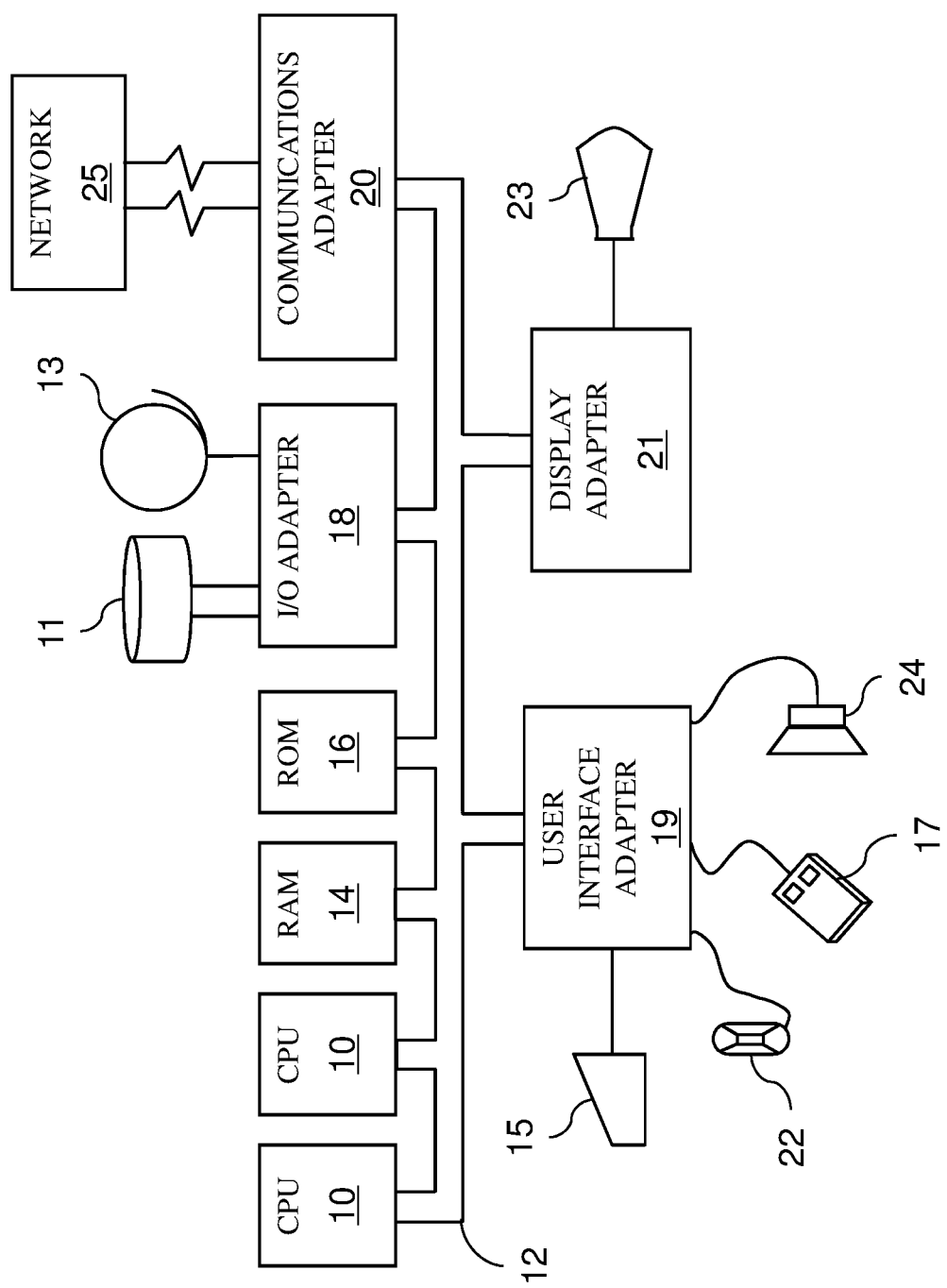
FIG. 6 is a schematic diagram illustrating an exemplary hardware system that can be used in the implementation of the design flow according to devices and methods herein.

A representative hardware environment for implementing the devices and methods herein is depicted in FIG. 6. This schematic drawing illustrates a hardware configuration of an information handling/computer system in accordance with the devices and methods herein. The system comprises at least one processor or central processing unit (CPU) 10. The CPUs 10 are interconnected via system bus 12 to various devices such as a Random Access Memory (RAM) 14, Read Only Memory (ROM) 16, and an Input/Output (I/O) adapter 18. The I/O adapter 18 can connect to peripheral devices, such as disk units 11 and tape drives 13, or other program storage devices that are readable by the system. The system can read the instructions on the program storage devices and follow these instructions to execute the methodology of the devices and methods herein.

In FIG. 6, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing, or the like, is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

The flowchart and block diagrams in the Figures illustrate the architecture, functionality, and operation of possible implementations of systems, methods, and computer program products according to various examples disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises," "comprising," and/or "including," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A computer program product for tailoring BEOL RC parametrics to improve chip performance in an integrated circuit design, said computer program product comprising a computer readable storage medium having program instructions embodied therewith, the program instructions being readable and executable by a computerized device to cause said computerized device to perform a method comprising:

analyzing a circuit design for an integrated circuit chip, said analyzing comprising determining Vmax for vias and metal lines in said circuit design over a range of sizes for said vias and metal lines, Vmax defining spacing between features on the integrated circuit chip due to time dependent dielectric breakdown based on-device characteristics;

determining predicted use voltage for applications on said integrated circuit chip;

comparing said predicted use voltage to said Vmax determined for said vias and metal lines; and creating a modified circuit design based on performance parameters of said integrated circuit chip, said modified circuit design using a lower voltage for Vmax.

2. The computer program product according to claim 1, said method further comprising:

tailoring the size or the location of at least one of said vias and said metal lines based on performance parameters of said integrated circuit chip.

3. The computer program product according to claim 1, said method further comprising:

providing printing and etching instructions for said vias and said metal lines according to said modified circuit design.

4. The computer program product according to claim 1, said determining said predicted use voltage comprising using test and inline data to predict the use voltage that said integrated circuit chip will actually experience in applications.

5. The computer program product according to claim 4, said determining said predicted use voltage being done on lot, wafer, or chip basis.

6. The computer program product according to claim 1, said method further comprising:
verifying said predicted use voltage being consistent with said lower voltage for Vmax.

7. The computer program product according to claim 6, said verifying further comprising determining frequency measurements of at least one performance sensitive ring oscillator (PSRO).

8. A system, comprising:
a data processor; and
a memory connected to said data processor, wherein
said data processor obtains a first file from said memory, wherein said first file contains a circuit design for an integrated circuit chip,
said data processor analyzes said circuit design for said integrated circuit chip by determining Vmax for vias and metal lines in said circuit design over a range of sizes for said vias and said metal lines, said Vmax defining spacing between features on the integrated circuit chip due to time dependent dielectric breakdown based on device characteristics,
said data processor determines predicted use voltage for applications on said integrated circuit chip,
said data processor compares said predicted use voltage to said Vmax determined for said vias and metal lines,
said data processor creates a modified circuit design based on performance parameters of said integrated circuit chip, said modified circuit design using a lower voltage for Vmax, and
said data processor stores said modified circuit design in a second file in said memory.

9. The system according to claim 8, wherein creating a modified circuit design based on performance parameters of said integrated circuit chip further comprises said data processor tailoring one of the size and the location of at least one of said vias and said metal lines based on performance parameters of said integrated circuit chip.

10. The system according to claim 8, wherein determining said predicted use voltage comprises using test and inline data to predict the use voltage that said integrated circuit chip will actually experience in applications.

11. The system according to claim 10, said determining said predicted use voltage being done on lot, wafer, or chip basis.

12. The system according to claim 8, further comprising:
said data processor verifying said predicted use voltage being consistent with said lower voltage for Vmax.

13. The system according to claim 12, further comprising:
at least one performance sensitive ring oscillator (PSRO), wherein said verifying further comprises determining frequency measurements of said at least one PSRO.

14. The system according to claim 8, further comprising:
manufacturing equipment, wherein said vias and said metal lines are printed and etched according to said modified circuit design.

15. A computer program product for tailoring BEOL RC parametrics in an integrated circuit design, said computer program product comprising a computer readable storage medium having program instructions embodied therewith, the program instructions being readable and executable by a computerized device to cause said computerized device to perform a method comprising:
determining maximum voltages defining a range of sizes for spaces between vias and metal lines in an integrated circuit design due to time dependent dielectric breakdown based on device characteristics;
determining predicted use voltage for applications on an integrated circuit chip having said integrated circuit design; and
using said predicted use voltage to adjust one of the size and the location of at least one of said vias and said metal lines in said integrated circuit design according to said range of sizes for said spaces between said vias and said metal lines while keeping said predicted use voltage below the maximum voltage associated with a selected space.

16. The computer program product according to claim 15, said method further comprising:
creating a modified circuit design based on performance parameters of said integrated circuit chip, said modified circuit design using a predicted use voltage below the maximum voltage associated with said selected space.

17. The computer program product according to claim 16, said modified circuit design being based on performance parameters of said integrated circuit chip using selected sizes of said vias and said metal lines.

18. The computer program product according to claim 16, said method further comprising:
providing printing and etching instructions for said vias and said metal lines according to said modified circuit design.

19. The computer program product according to claim 15, said determining said predicted use voltage comprising using test and inline data to predict the use voltage that said integrated circuit chip will actually experience in applications.

20. The computer program product according to claim 15, said method further comprising:
verifying said predicted use voltage being consistent with a lower voltage for the maximum voltage associated with said selected space.

* * * * *